United States Patent
Gunawan

(10) Patent No.: US 10,593,456 B2
(45) Date of Patent: Mar. 17, 2020

(54) LEVITATED MOTOR-ACTUATOR WITH PARALLEL DIPOLE LINE TRAP SYSTEM

(71) Applicant: International Business Machines Corporation, Armonk, NY (US)

(72) Inventor: Oki Gunawan, Westwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 15/784,371

(22) Filed: Oct. 16, 2017

(65) Prior Publication Data

US 2019/0115132 A1    Apr. 18, 2019

(51) Int. Cl.
| | | |
|---|---|---|
| H02K 21/00 | (2006.01) | |
| H01F 7/02 | (2006.01) | |
| H02N 15/00 | (2006.01) | |
| B81B 3/00 | (2006.01) | |
| B81B 7/00 | (2006.01) | |

(52) U.S. Cl.
CPC ......... *H01F 7/0236* (2013.01); *B81B 3/0021* (2013.01); *B81B 3/0091* (2013.01); *B81B 7/008* (2013.01); *H02N 15/00* (2013.01); *B81B 2201/034* (2013.01); *B81B 2203/04* (2013.01)

(58) Field of Classification Search
CPC ..... H02K 7/09; H01F 7/0236; F16C 32/0408; B81B 3/0021; B81B 3/0091; B81B 2201/034; B81B 2203/04; H02N 1/00; H02N 15/00
See application file for complete search history.

(56) References Cited

U.S. PATENT DOCUMENTS

| | | | | |
|---|---|---|---|---|
| 5,710,531 A | * | 1/1998 | Abolafia | ............... H02K 19/18 310/10 |
| 6,355,998 B1 | * | 3/2002 | Schob | ................ F16C 32/0493 310/68 B |
| 7,252,001 B2 | | 8/2007 | Boletis et al. | |
| 7,597,002 B2 | | 10/2009 | Moser et al. | |

(Continued)

FOREIGN PATENT DOCUMENTS

| | | |
|---|---|---|
| WO | WO2007125129 A1 | 11/2007 |
| WO | WO2007136406 A2 | 11/2007 |
| WO | WO2016061452 A1 | 4/2016 |

OTHER PUBLICATIONS

Gunawan et al., "A parallel dipole line system," Applied Physics Letters 106, pp. 062407-1-062407-5 (Feb. 2015).

(Continued)

*Primary Examiner* — Thanh Lam
(74) *Attorney, Agent, or Firm* — Vazken Alexanian; Michael J. Chang, LLC

(57) ABSTRACT

A motor-actuator device using a PDL trap system is provided. In one aspect, a motor-actuator device includes: a PDL trap having a pair of diametric magnets, and a levitated diamagnetic rotor in between the diametric magnets, wherein at least a portion of the diamagnetic rotor has a rectangular shape; and an electrode shell having at least one pair of semicircular electrodes which surround, but are in a non-contact position with the levitated diamagnetic rotor and each other. A system including the motor-actuator device and an electrode driver circuit is also provided, as is a method of operating the motor-actuator device.

20 Claims, 5 Drawing Sheets

FIG. 1B

(56) References Cited

U.S. PATENT DOCUMENTS

| | | | |
|---|---|---|---|
| 8,169,114 B2* | 5/2012 | Simon | H02N 15/00 |
| | | | 310/12.31 |
| 8,895,355 B2 | 11/2014 | Cao et al. | |
| 9,093,377 B2 | 7/2015 | Cao et al. | |
| 9,236,293 B2 | 1/2016 | Cao et al. | |
| 9,263,669 B2 | 2/2016 | Cao et al. | |
| 9,424,971 B2 | 8/2016 | Cao et al. | |
| 9,689,934 B2 | 6/2017 | Khamesee et al. | |
| 9,878,636 B2* | 1/2018 | Irvin, Sr. | B60L 13/04 |
| 2006/0145796 A1 | 7/2006 | Delamare et al. | |
| 2009/0160279 A1 | 6/2009 | Baur | |
| 2015/0115756 A1 | 4/2015 | Walsh | |
| 2018/0238333 A1* | 8/2018 | Jalali | F04D 5/001 |

OTHER PUBLICATIONS

Gunawan et al. "The one-dimensional camelback potential in the parallel dipole line trap: Stability conditions and finite size effect," J. Appl. Phys. 121, pp. 133902-1-133902-10 (Apr. 2017).

R.H. Austin et al. "Diamagnetic Levitation," Princeton University, pp. 1-11 (Nov. 2001).

* cited by examiner

US 10,593,456 B2

LEVITATED MOTOR-ACTUATOR WITH PARALLEL DIPOLE LINE TRAP SYSTEM

FIELD OF THE INVENTION

The present invention relates to magnetic parallel dipole line (PDL) trap systems, and more particularly, to a motor-actuator device using a PDL trap system.

BACKGROUND OF THE INVENTION

There is a need to construct miniature, micro-scale motors for various applications such as micromechanical systems for micro and nanotechnology. Unfortunately, traditional electric motor systems prohibit down scaling due to the various components needed for the designs and the overall contact nature of the system.

As such, a dramatically different electric motor architecture is needed that allows miniaturization. One important requirement at small scale is that the motor has to have a non-contact design, otherwise the friction loss over the rotational kinetic energy of the system becomes too large making the operation of the motor very difficult if not impossible. Another important factor at play in micromechanical systems is the significant adhesion force between micro- and nano-scale objects attributed to van der Walls and Casimir force.

Thus, an improved, scalable electric motor architecture would be desirable.

SUMMARY OF THE INVENTION

The present invention provides a motor-actuator device using a parallel dipole line (PDL) trap system. In one aspect of the invention, a motor-actuator device is provided. The motor-actuator device includes: a PDL trap having a pair of diametric magnets, and a levitated diamagnetic rotor in between the diametric magnets, wherein at least a portion of the diamagnetic rotor has a rectangular shape; and an electrode shell having at least one pair of semicircular electrodes which surround, but are in a non-contact position with the levitated diamagnetic rotor and each other.

In another aspect of the invention, a system is provided. The system includes: a motor-actuator device including: i) a PDL trap having a pair of diametric magnets, and a levitated diamagnetic rotor in between the diametric magnets, wherein at least a portion of the diamagnetic rotor has a rectangular shape, and ii) an electrode shell having at least one pair of semicircular electrodes which surround, but are in a non-contact position with the levitated diamagnetic rotor and each other; and an electrode driver circuit connected to each electrode in the electrode shell and which is configured to apply electric pulses to the at least one pair of semicircular electrodes.

In yet another aspect of the invention, a method of operating a motor-actuator device is provided. The method includes: providing the motor-actuator device having: i) a PDL trap having a pair of diametric magnets, and a levitated diamagnetic rotor in between the diametric magnets, wherein at least a portion of the diamagnetic rotor has a rectangular shape, and ii) an electrode shell having at least one pair of semicircular electrodes which surround, but are in a non-contact position with the levitated diamagnetic rotor and each other; and applying electric pulses to the at least one pair of semicircular electrodes causing the levitated diamagnetic rotor to rotate.

A more complete understanding of the present invention, as well as further features and advantages of the present invention, will be obtained by reference to the following detailed description and drawings.

DETAILED DESCRIPTION OF PREFERRED EMBODIMENTS

Provided herein are miniature levitated electric motors using a parallel dipole line (PDL) trap system. As will be described in detail below, the present motor design can be implemented using a capacitive drive system with multiple electrodes enclosing, but not physically contacting, a levitated object (the rotor) levitated in the PDL trap. Since the system operates in a levitated state, advantageously there is no friction or adhesion force other than viscous forces due to air. As such, the system requires a small amount of power to operate and is scalable to very small sizes, i.e., in the micro-scale range.

The present PDL trap-based motor system also provides an additional notable feature. By controlling the voltage bias, the position of the rotor can be controlled. Thus, the system also serves as a linear actuator.

A PDL trap consists of a magnetic parallel dipole line system made of a pair of transversely magnetized cylindrical (or diametric) magnets that naturally join together. See, for example, FIG. 1A where the magnetization M points along the diameter of the cylindrical diametric magnets. The system can trap a diamagnetic object at the center. See, for example, Gunawan et al., "A parallel dipole line system," Applied Physics Letters 106, pp. 062407-1-5 (February 2015) (hereinafter "Gunawan 2015"); Gunawan et al. "The one-dimensional camelback potential in the parallel dipole line trap: Stability conditions and finite size effect," J. Appl. Phys. 121, pp. 133902-1-10 (April 2017) (hereinafter "Gunawan 2017"); and U.S. Pat. Nos. 8,895,355, 9,093,377, 9,236,293, and 9,263,669 all issued to Cao et al., entitled "Magnetic Trap for Cylindrical Diamagnetic Materials," the contents of each of which are incorporated by reference as if fully set forth herein.

The central feature of the PDL trap is the existence of a "camelback magnetic potential" along the longitudinal (z-axis), i.e., the magnetic field is enhanced near the edge of the dipole line which occurs for a diametric magnet with length L approximately L>2.5a, wherein α is the radius of the magnet. See, for example, FIG. 1 of Gunawan 2017.

Figure 1A:
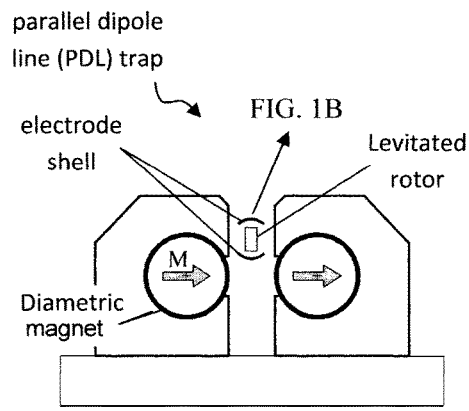
FIG. 1A is a diagram illustrating a parallel dipole line (PDL) trap according to an embodiment of the present invention.

According to an exemplary embodiment of the present PDL trap-based motor design, the trapped diamagnetic object is a rectangular slab of an electrically conductive material, such as graphite. This trapped diamagnetic object will serve as the rotor, i.e., it is the component of the motor that spins and/or is actuated. See FIG. 1A. As shown in FIG. 1A, the rectangular slab is trapped and levitates ("levitated rotor") inside the PDL trap.

Figure 1B:
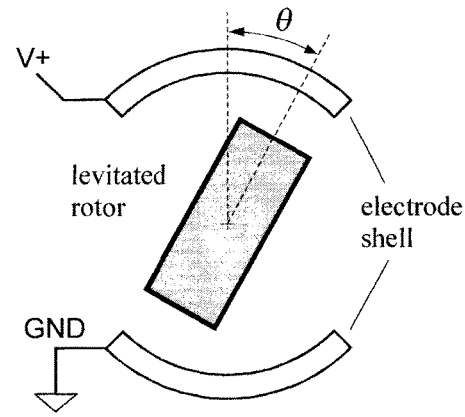
FIG. 1B is a diagram illustrating an enlarged view of a rectangular slab that is trapped and levitates inside the PDL trap and is surrounded by an electrode shell according to an embodiment of the present invention.

A pair of electrode shells are used surrounding (but not in physical contact with) the rectangular slab that serve a capacitor. An enlarged view of the rectangular slab and electrode shells is shown in FIG. 1B. Namely, as shown in FIG. 1B a voltage bias (V+/ground (GND)) is applied to the electrode shells.

As the rectangular slab rotates, the capacitance of the system changes. This change of capacitance (C) as a function of angular displacement (θ) will create a torque (τ) as the voltage bias (V) is applied:

$$U = \frac{1}{2}CV^2 \quad (1)$$

$$C = C_0 + \Delta C \cos 2\theta,$$

wherein the system torque (τ) is:

$$\tau = \partial U/\partial \theta = -\Delta C V^2 \cos 2\theta \quad (2)$$

Figure 2:
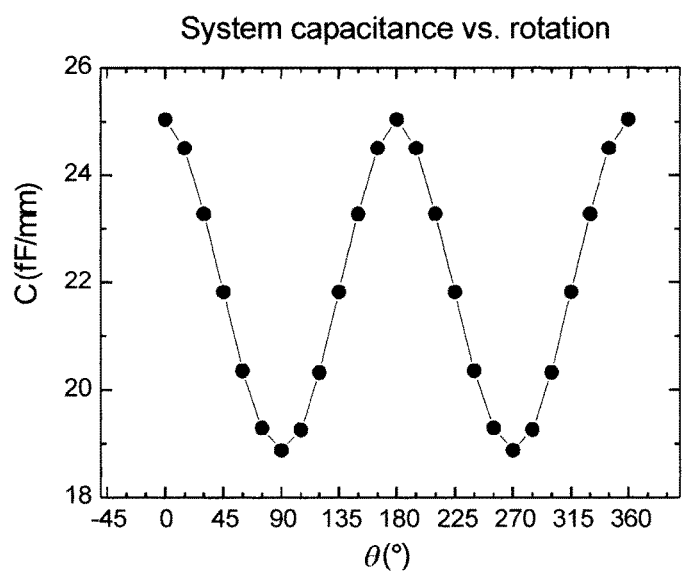
FIG. 2 is a diagram illustrating system capacitance variation versus angle ($\theta$) for the present PDL trap motor capacitor drive system according to an embodiment of the present invention.

Therefore, by applying voltage bias pulses torque is applied to and rotates the rectangular slab/levitated rotor. See, for example, FIG. 2 which illustrates system capacitance variation C (measured in capacitance per unit length: fF/mm or femtofarad per millimeter) versus angle (in degrees (°).

As provided above, another notable feature of the present system is that it can also serve as a linear actuator. For instance, consider a parallel plate capacitor model consisting of top and bottom electrode plates, and a conductor that freely moves along the z-axis at constant spacing $d_1$ and $d_2$ between the electrode plates. See, for example, FIGS. 1 and 2 of U.S. patent application Ser. No. 15/131,443 by Oki Gunawan, entitled "Voltage-Tunable 1D Electro-Magnet Potential and Probe System with Parallel Dipole Line Trap" (hereinafter "U.S. patent application Ser. No. 15/131,443"), the contents of which are incorporated by reference as if fully set forth herein.

The capacitance C (per unit normal length l) as a function of the conductor center position (z) is given as:

$$C(z) = \varepsilon_0 \begin{cases} \frac{w}{d_0} & |z| > (w+l)/2 \\ \frac{z + w/2}{d_1 + d_2} + \frac{w/2 - z}{d_0} & (w-l)/2 < |z| < (w+l)/2, \\ \frac{l}{d_1 + d_2} + \frac{w - l}{d_0} & |z| < (w+l)/2 \end{cases} \quad (3)$$

wherein |x| is the absolute value of z. The capacitance of the system increases as the conductor enters in between the electrode plates. This happens because the conductor screens out all electric field, thus effectively making the spacing between the electrode plates smaller.

Assuming an isolated system and that the electrode plate is charged by an amount Q, then the energy of the capacitor $U_C$ is:

$$U_C = Q^2/2C. \quad (4)$$

This means that the internal energy is lower when the conductor is in between the electrode plates implying that, if the conductor moves freely, it will get attracted toward the center of the capacitor.

The PDL trap with top electrode yields a tunable 1D hybrid magneto-electric potential system for the diamagnetic rod levitating at height $y_0$. The energy potential per unit volume has two components:

(1) Magnetic energy potential (the camelback PDL potential):

$$U_M(z) = -\frac{\chi}{2+\chi} \frac{B_{PDL}(z)^2}{\mu_0} \quad (5)$$

(2) Electric energy potential (capacitive potential) tunable by voltage V:

$$U_E(z) = -\frac{1}{2}C(z)V^2 \quad (6)$$

Thus, the final total energy ($U_{ME}$) is:

$$U_T(z) = -\frac{\chi}{2+\chi} \frac{B_{PDL}(z)^2}{\mu_0} - \frac{1}{2}C(z)V^2, \quad (7)$$

wherein χ is the magnetic susceptibility of the diamagnetic object (which has a negative value), the physical constant $\mu_0$ is the magnetic permeability of vacuum, and V is the voltage bias and C(z) is the capacitance of the system as a function of rod position z as described in Equation 3 above.

Figure 6:
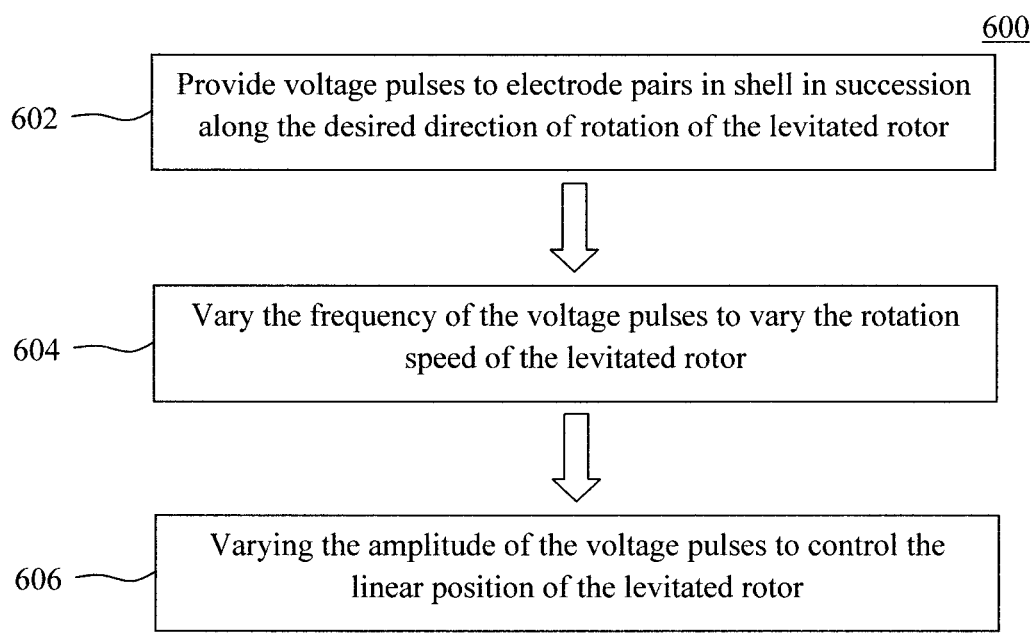
FIG. 6 is a diagram illustrating an exemplary methodology for operating the present levitated motor-actuator device according to an embodiment of the present invention.

Referring, for example, to FIG. 6 in U.S. patent application Ser. No. 15/131,443, the magnetic camelback potential provides the base confinement for the PDL trap. With increasing voltage there is a negative electrostatic potential contribution underneath the electrode that pulls the trapped object towards the electrode. In other words, with increasing voltage bias the minimum of the magneto-electric camelback potential shifts towards the electrode. As such, this yields a voltage-controlled tunable 1D potential and the position of the diamagnetic object in the PDL trap can be controlled with the voltage bias. In this levitated rotor application, the diamagnetic rod would be shaped to have a rectangular cross section that allows variation in the capacitance as a function of angular rotation.

A combination of the above-described principles relating to rotation and linear actuation of the rectangular slab in the PDL trap is leveraged herein to produce a hybrid motor-actuator system. See, for example, FIGS. 3-6.

Figure 3:
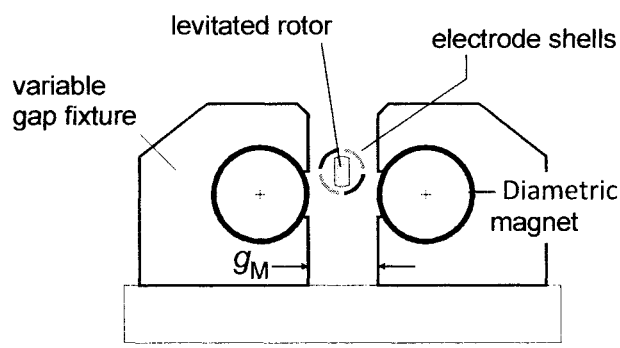
FIG. 3 is a diagram illustrating a front view of the present levitated motor-actuator device according to an embodiment of the present invention.
Figure 4:
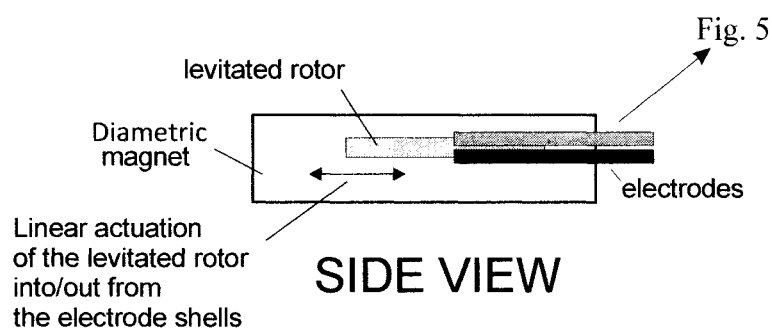
FIG. 4 is a diagram illustrating a side view of the present levitated motor-actuator device according to an embodiment of the present invention.

FIG. 3 provides a front view of the present levitated motor-actuator. As shown in FIG. 3, the device includes a PDL trap having a pair of dipole line magnets (or PDL magnets). In the present example, the PDL magnets are each affixed to a variable gap fixture which serves to move the PDL magnets apart from one another, thereby creating a gap $g_M$ between the magnets. A suitable variable gap fixture for use in accordance with the present techniques is described, for example, in U.S. patent application Ser. No. 15/131,566 by Oki Gunawan, entitled "Parallel Dipole Line Trap with Variable Gap and Tunable Trap Potential" (hereinafter "U.S. patent application Ser. No. 15/131,566"), the contents of which are incorporated by reference as if fully set forth herein.

The levitated rotor levitates in between the PDL magnets. As provided above, the levitated rotor can be a rectangular diamagnetic slab. As shown in FIG. 3, an electrode shell is present surrounding the levitated rotor. As will be described in detail below, the 'motor' action of the device involves the levitated rotor spinning within the electrode shell which is driven by electric pulses to individual pairs of electrodes in the shell. The 'actuator' motion of the device involves the levitated rotor moving linearly into/out from the electrode shell. See, for example, FIG. 4 which provides a side view of the device. More specifically, a double-sided arrow is used in FIG. 4, to indicate movement (actuation) of the levitated rotor linearly into and out from the electrode shell. Linear actuation of the device is driven by the amplitude of the electric pulses which will pull the levitated rotor in or out from the electrode shell.

The electrode shell includes at least one pair of semicircular electrodes which surround but do not contact/touch the levitated rotor (or each other). For instance referring again to FIG. 3, in this example the electrode shell includes two pairs of semicircular electrodes. To smoothen the operation further and to increase torque, more than two pairs of semicircular electrodes can be added to the shell, if so desired, and configurations including more than two pairs of semicircular electrodes are contemplated herein. Each pair of semicircular electrodes is shown with like shading.

Figure 5:
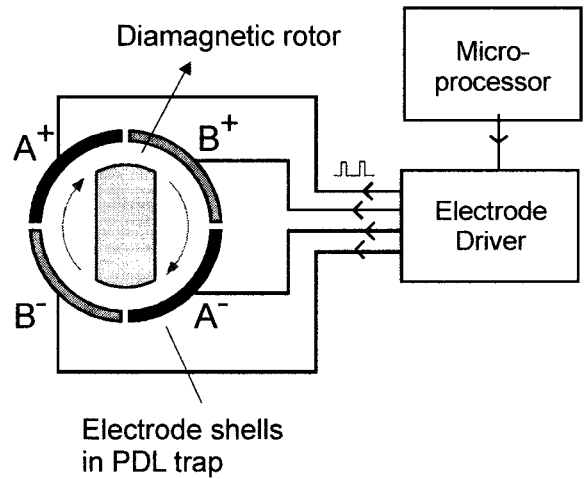
FIG. 5 is a schematic diagram illustrating a system having the present levitated motor-actuator device along with an electrode driver and microprocessor according to an embodiment of the present invention.

Operation of the present levitated rotor motor-actuator device is now described by way of reference to the motor-actuator system shown in FIG. 5. FIG. 5 provides a schematic diagram of the levitated diamagnetic rotor within the electrode shell. In this example, the electrode shell is made up of two pairs (A and B) of the semicircular electrodes surrounding the levitated rotor. Each pair consists of the two electrodes opposite one another along the circumference of the shell, e.g., the pair of electrodes A are opposite one another, as are the pair of electrodes B. See FIG. 5.

An electrode driver circuit ("electrode driver") is connected to each of the electrodes and serves to deliver the proper phase electric pulse to the electrode pairs at the proper frequency. For instance, referring to methodology 600 of FIG. 6, in step 602 the electrode driver applies voltage pulses to the electrode pairs in succession along the desired direction of rotation. For example, the electrode driver first applies a voltage bias to electrode pair A (A+ and A−). This causes the levitated rotor to commence spinning (i.e., motor action) within the electrode shell. To perpetuate this motion, a voltage bias is then applied (via the electrode driver) to the next electrode pair in the shell along the desired direction of rotation (in this example clockwise—i.e., electrode pair B (B+ and B−), while removing the voltage bias from electrode pair A. The process is then repeated, alternately applying a bias voltage to the electrode pair A followed by the electrode pair B, and so on. The frequency with which these electric pulses are applied to the electrode pairs determines the speed of rotation. For instance, increasing/decreasing the frequency of the electric pulses increases/decreases the speed at which the levitated rotor rotates. See step 604. As provided above, increasing the number of electrode pairs in the shell can smoothen operation as well as increase the torque of the motor.

With regard to linear actuation motion, as provided above the position of the diamagnetic object in the PDL trap can be controlled via the voltage bias by shifting the minimum of the magneto-electric camelback potential. Namely, by varying the amplitude of the voltage bias being applied to the electrode shell by the electrode driver (see above), the linear position of the levitated rotor relative to the electrode shells can be changed (i.e., actuating the levitated rotor in the device). See step 606.

It is notable that the motor and linear actuation functions of the device can be operated together. For instance, the electrode driver can apply the electric pulses in the above-described manner to cause the levitated rotor to spin, while at the same time varying the amplitude of the electric pulses to linearly actuate the (spinning) levitated rotor. The device can also be operated as a motor independent of a linear actuation, and vice versa.

Referring back to FIG. 5, operation of the electrode driver can be controlled via a microprocessor. For instance, the microprocessor can control the frequency and/or amplitude of the electric pulses to control the rotation and speed of the levitated rotor and/or linear actuation of the levitated rotor in the device. The microprocessor might be a component in an apparatus, such as described in conjunction with the description of FIG. 8, below.

Figure 7:
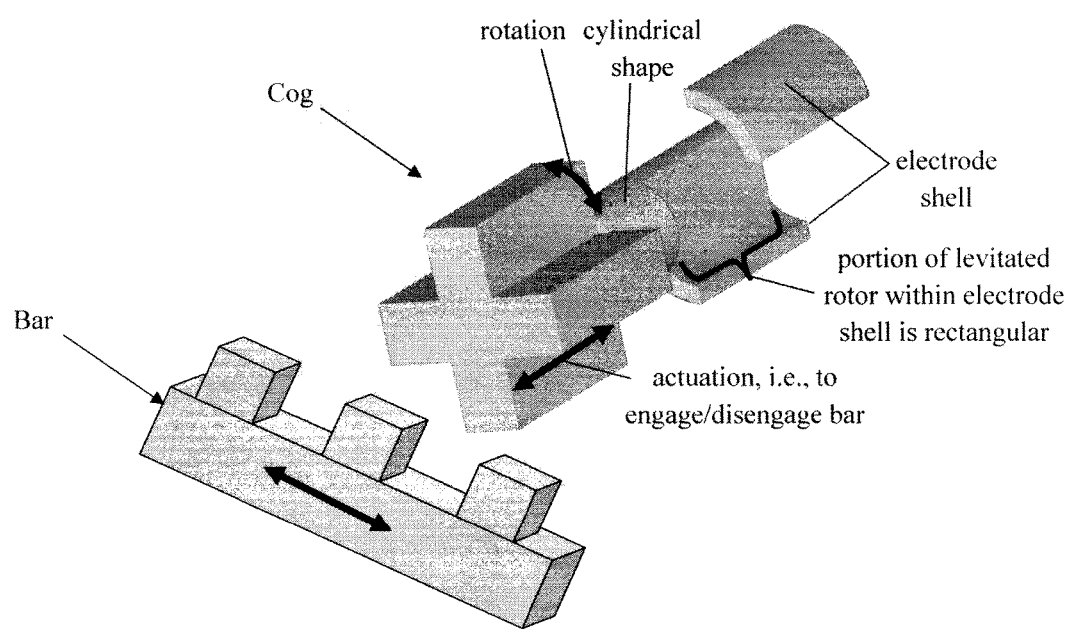
FIG. 7 is a three-dimensional diagram illustrating an exemplary design of the present levitated motor-actuator device with a levitated rotor having both a rectangular portion and a non-rectangular portion according to an embodiment of the present invention.

A variety of different motor-actuator designs can be implemented in accordance with the present techniques. For instance, as shown in the three-dimensional rendering provided in FIG. 7, the end of the levitated rotor can be patterned in a variety of different shapes, configurations, and/or designs. To use a simple non-limiting example, the end of the levitated rotor can be configured with a plurality of cogs. The above-described process can be implemented to rotate the levitated rotor and, when the spinning, levitated rotor is actuated out from the device, can engage another wheel or bar to perform work. Retraction (via linear actuation in the opposite direction), disengages the motor-actuator from the wheel/bar. Again, this is merely one exemplary implementation of the present device.

One important design consideration is, regardless of the shape/configuration of the end of the levitated rotor, the portion of the levitated rotor within the electrode shell has to be rectangular. As described above, a rectangular shape is needed for rotation of the levitated rotor. See FIG. 7 where the portion of the levitated rotor within the electrode shell is rectangular, whereas portions (to the left of the electrode shell in this example) are non-rectangular, e.g., cylindrical and cog-shaped.

Figure 8:
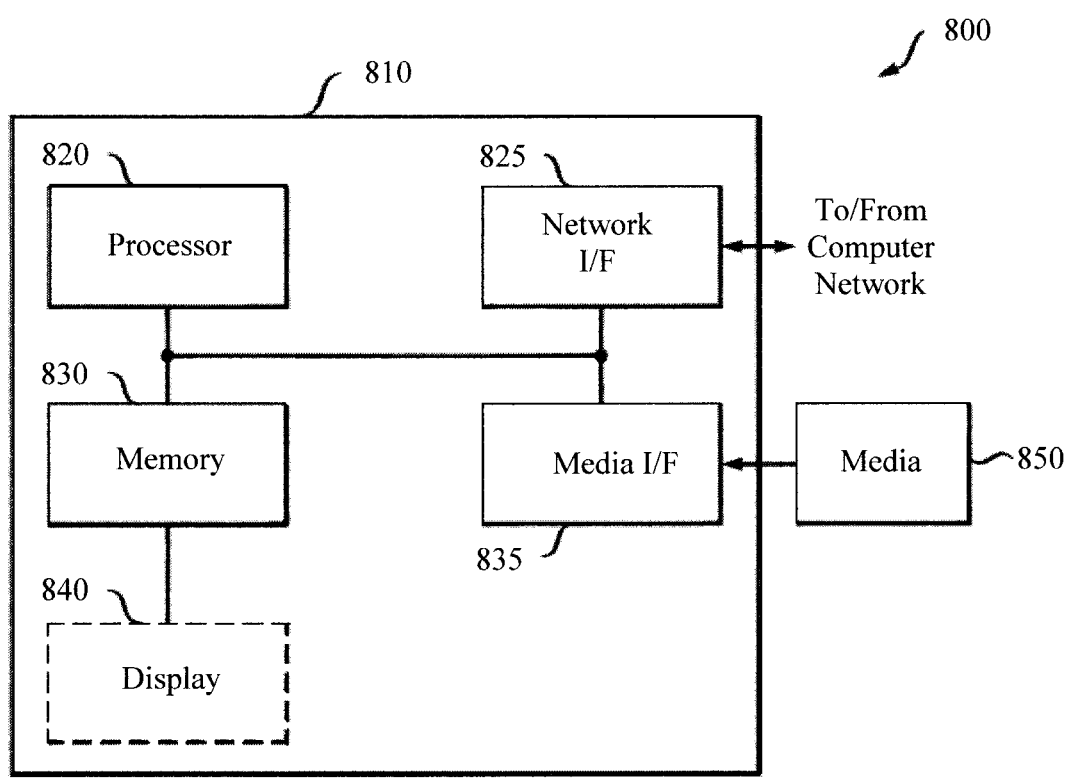
FIG. 8 is a diagram illustrating an exemplary apparatus for use in operating the present levitated motor-actuator device according to an embodiment of the present invention.

Turning now to FIG. 8, a block diagram is shown of an apparatus 800 that can be used in operating the present levitated motor-actuator device. For instance, as provided above, a microprocessor can be used to control the electrode driver. That microprocessor can be part of apparatus 800.

Apparatus 800 includes a computer system 810 and removable media 850. Computer system 810 includes a processor device 820 (e.g., a microprocessor, CPU etc.), a network interface 825, a memory 830, a media interface 835 and an optional display 840. Network interface 825 allows computer system 810 to connect to a network, while media interface 835 allows computer system 810 to interact with media, such as a hard drive or removable media 850.

Processor device 820 can be configured to implement the methods, steps, and functions disclosed herein. The memory 830 could be distributed or local and the processor device 820 could be distributed or singular. The memory 830 could be implemented as an electrical, magnetic or optical memory, or any combination of these or other types of storage devices. Moreover, the term "memory" should be construed broadly enough to encompass any information able to be read from, or written to, an address in the addressable space accessed by processor device 820. With this definition, information on a network, accessible through network interface 825, is still within memory 830 because the processor device 820 can retrieve the information from the network. It should be noted that each distributed processor that makes up processor device 820 generally contains its own addressable memory space. It should also be noted that some or all of computer system 810 can be incorporated into an application-specific or general-use integrated circuit.

Optional display 840 is any type of display suitable for interacting with a human user of apparatus 800. Generally, display 840 is a computer monitor or other similar display.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A motor-actuator device, comprising:
a parallel dipole line (PDL) trap having a pair of diametric magnets, and a levitated diamagnetic rotor in between the diametric magnets, wherein at least a portion of the diamagnetic rotor has a rectangular shape; and
an electrode shell comprising at least one pair of semicircular electrodes which surround, but are in a non-contact position with the levitated diamagnetic rotor and each other.

2. The motor-actuator device of claim 1, wherein the diametric magnets are separated from one another by a gap $g_M$.

3. The motor-actuator device of claim 1, wherein the electrode shell comprises more than one pair of the semicircular electrodes.

4. The motor-actuator device of claim 3, wherein the electrode shell comprises at least two pairs of the semicircular electrodes.

5. The motor-actuator device of claim 1, wherein at least a first portion of the levitated diamagnetic rotor within the electrode shell has the rectangular shape, and wherein at least one second portion of the levitated diamagnetic rotor outside of the electrode shell has a non-rectangular shape.

6. A system, comprising:
a motor-actuator device comprising: i) a PDL trap having a pair of diametric magnets, and a levitated diamagnetic rotor in between the diametric magnets, wherein at least a portion of the diamagnetic rotor has a rectangular shape, and ii) an electrode shell comprising at least one pair of semicircular electrodes which surround, but are in a non-contact position with the levitated diamagnetic rotor and each other; and
an electrode driver circuit connected to each electrode in the electrode shell and which is configured to apply electric pulses to the at least one pair of semicircular electrodes.

7. The system of claim 6, further comprising:
a microprocessor connected to the electrode driver circuit configured to control the electric pulses provided by the electrode driver to the at least one pair of semicircular electrodes.

8. The system of claim 7, wherein the microprocessor is configured to control at least one of a frequency and an amplitude of the electric pulses provided by the electrode driver to the at least one pair of semicircular electrodes.

9. The system of claim 6, wherein the diametric magnets are separated from one another by a gap $g_M$.

10. The system of claim 6, wherein the electrode shell comprises more than one pair of the semicircular electrodes.

11. The system of claim 10, wherein the electrode shell comprises at least two pairs of the semicircular electrodes.

12. The system of claim 6, wherein at least a first portion of the levitated diamagnetic rotor within the electrode shell has the rectangular shape, and wherein at least one second portion of the levitated diamagnetic rotor outside of the electrode shell has a non-rectangular shape.

13. A method of operating a motor-actuator device, the method comprising the steps of:
providing the motor-actuator device comprising: i) a PDL trap having a pair of diametric magnets, and a levitated diamagnetic rotor in between the diametric magnets, wherein at least a portion of the diamagnetic rotor has a rectangular shape, and ii) an electrode shell comprising at least one pair of semicircular electrodes which surround, but are in a non-contact position with the levitated diamagnetic rotor and each other; and
applying electric pulses to the at least one pair of semicircular electrodes causing the levitated diamagnetic rotor to rotate.

14. The method of claim 13, wherein the electric pulses are applied to the at least one pair of semicircular electrodes using an electrode driver circuit that is connected to each electrode in the electrode shell.

15. The method of claim 13, further comprising the step of:
varying a frequency of the electric pulses applied to the at least one pair of semicircular electrodes using the electrode driver circuit to vary a speed at which the levitated diamagnetic rotor rotates.

16. The method of claim 13, further comprising the step of:
varying an amplitude of the electric pulses applied to the at least one pair of semicircular electrodes using the electrode driver circuit to linearly actuate the levitated diamagnetic rotor in the motor-actuator device.

17. The method of claim 13, wherein the diametric magnets are separated from one another by a gap $g_M$.

18. The method of claim 13, wherein the electrode shell comprises more than one pair of the semicircular electrodes.

19. The method of claim 18, wherein the electrode shell comprises at least two pairs of the semicircular electrodes, the method further comprising the steps of:
applying a voltage bias to a first pair of the least two pairs of the semicircular electrodes to cause the levitated diamagnetic rotor to rotate;
removing the voltage bias from the first pair of the least two pairs of the semicircular electrodes; and applying the voltage bias to a second pair of the at least two pairs of the semicircular electrodes along a desired direction of rotation to perpetuate rotation of the levitated diamagnetic rotor.

20. The method of claim 13, wherein at least a first portion of the levitated diamagnetic rotor within the electrode shell has the rectangular shape, and wherein at least one second portion of the levitated diamagnetic rotor outside of the electrode shell has a non-rectangular shape.

\* \* \* \* \*